(12) United States Patent
Yang et al.

(10) Patent No.: US 10,468,527 B2
(45) Date of Patent: Nov. 5, 2019

(54) METAL GATE STRUCTURE AND METHODS OF FABRICATING THEREOF

(71) Applicant: Taiwan Semiconductor Manufacturing Co., Ltd., Hsinchu (TW)

(72) Inventors: I-Wei Yang, Hsinchu (TW); Chih-Chang Hung, Hsinchu (TW); Shu-Yuan Ku, Hsinchu County (TW); Ryan Chia-Jen Chen, Chiayi (TW); Ming-Ching Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/998,687

(22) Filed: Aug. 15, 2018

(65) Prior Publication Data

US 2019/0148539 A1  May 16, 2019

Related U.S. Application Data

(60) Provisional application No. 62/586,658, filed on Nov. 15, 2017.

(51) Int. Cl.
*H01L 29/66* (2006.01)
*H01L 21/8238* (2006.01)
(Continued)

(52) U.S. Cl.
CPC ........ *H01L 29/785* (2013.01); *H01L 21/0337* (2013.01); *H01L 21/76283* (2013.01); *H01L 21/82385* (2013.01); *H01L 21/823437* (2013.01); *H01L 21/823481* (2013.01); *H01L 21/823821* (2013.01); *H01L 23/5329* (2013.01); *H01L 27/0886* (2013.01);
(Continued)

(58) Field of Classification Search
CPC ....... H01L 21/32136; H01L 21/823431; H01L 21/823821; H01L 21/845; H01L 27/0886; H01L 27/0924; H01L 27/10826; H01L 27/10879; H01L 27/1211; H01L 29/401; H01L 29/41791; H01L 29/66795–66818; H01L 29/785–7856; H01L 2029/7857–7858; H01L 2924/13067
See application file for complete search history.

(56) References Cited

U.S. PATENT DOCUMENTS 8,772,109 B2   7/2014   Colinge
8,785,285 B2   7/2014   Tsai et al.
(Continued)

*Primary Examiner* — Daniel P Shook
(74) *Attorney, Agent, or Firm* — Haynes and Boone, LLP

(57) ABSTRACT

A semiconductor device and method of forming thereof includes a first fin and a second fin each extending from a substrate. A first gate segment is disposed over the first fin and a second gate segment is disposed over the second fin. An interlayer dielectric (ILD) layer is adjacent the first gate segment and the second gate segment. A cut region (e.g., opening or gap between first gate structure and the second gate structure) extends between the first and second gate segments. The cut region has a first portion has a first width and a second portion has a second width, the second width is greater than the first width. The second portion interposes the first and second gate segments and the first portion is defined within the ILD layer.

20 Claims, 15 Drawing Sheets

(51) Int. Cl.
*H01L 29/06* (2006.01)
*H01L 29/78* (2006.01)
*H01L 23/532* (2006.01)
*H01L 21/033* (2006.01)
*H01L 21/762* (2006.01)
*H01L 21/8234* (2006.01)
*H01L 27/088* (2006.01)

(52) U.S. Cl.
CPC .... *H01L 29/0649* (2013.01); *H01L 29/66795* (2013.01); *H01L 29/66545* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,163,640 B1* | 12/2018 | Hsieh ................ H01L 29/66795 |
| 2017/0358681 A1* | 12/2017 | Chang ................ H01L 29/7856 |

* cited by examiner

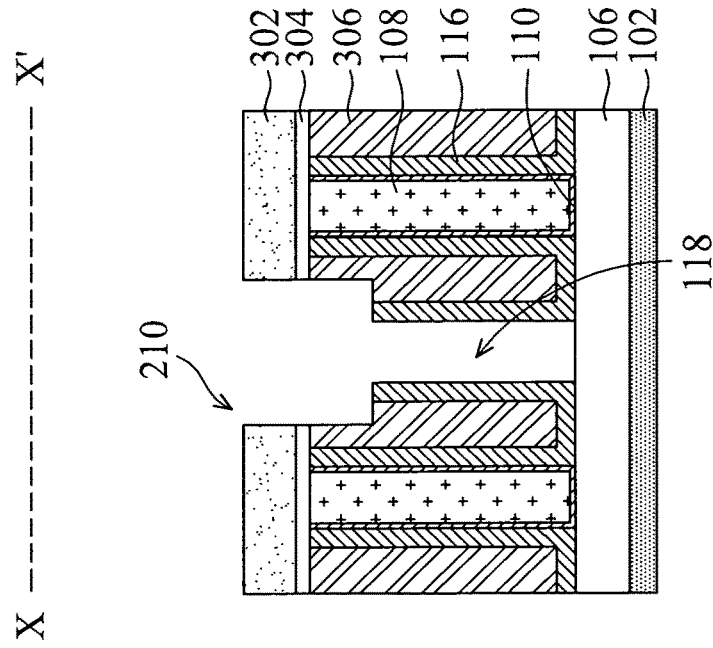
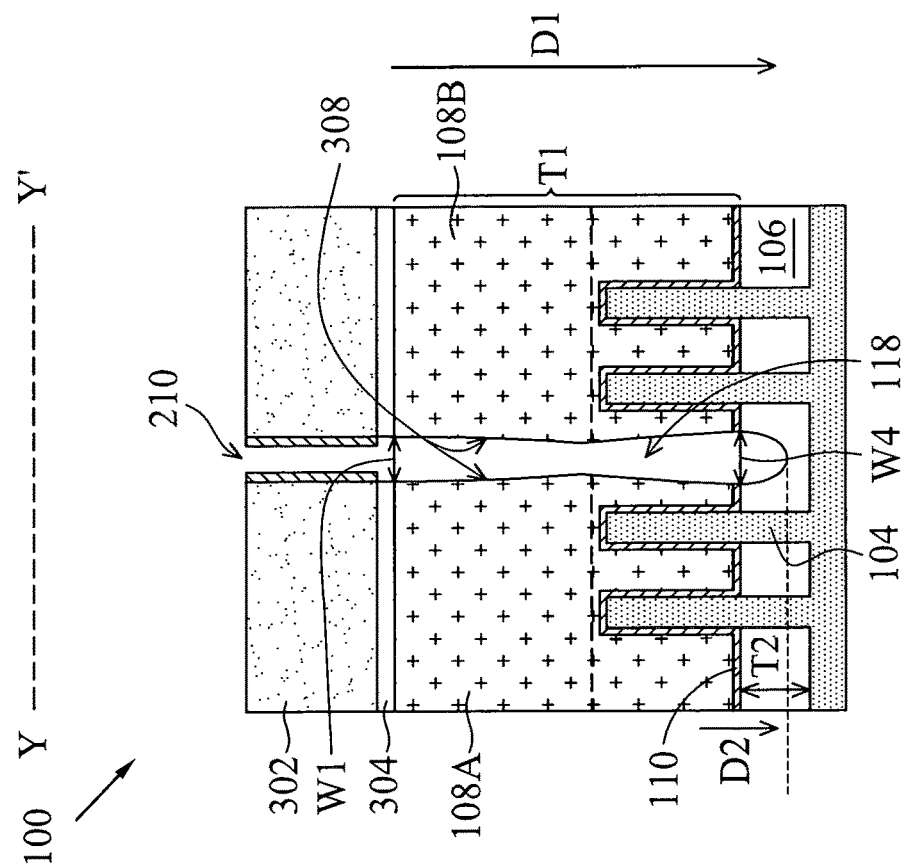
FIG. 3B
FIG. 3A

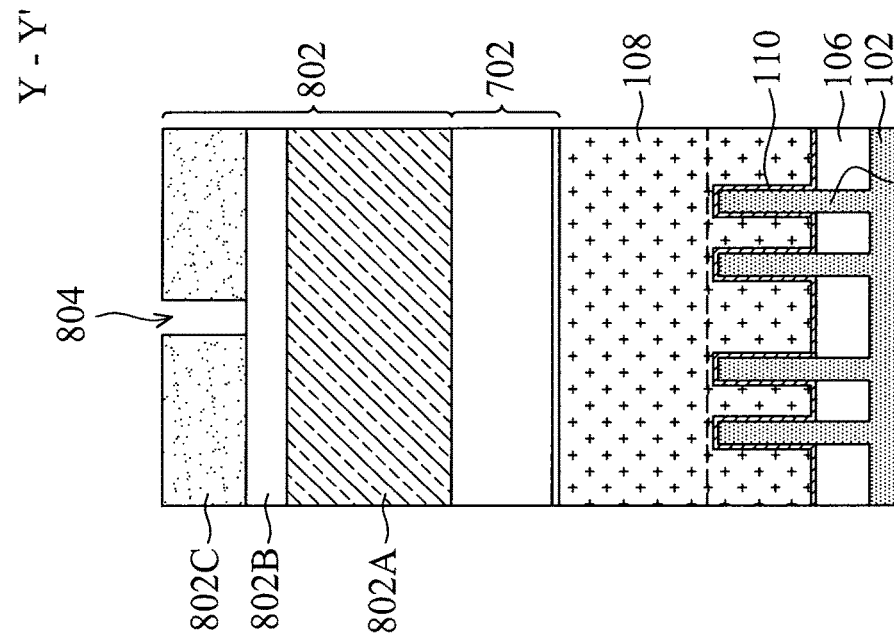
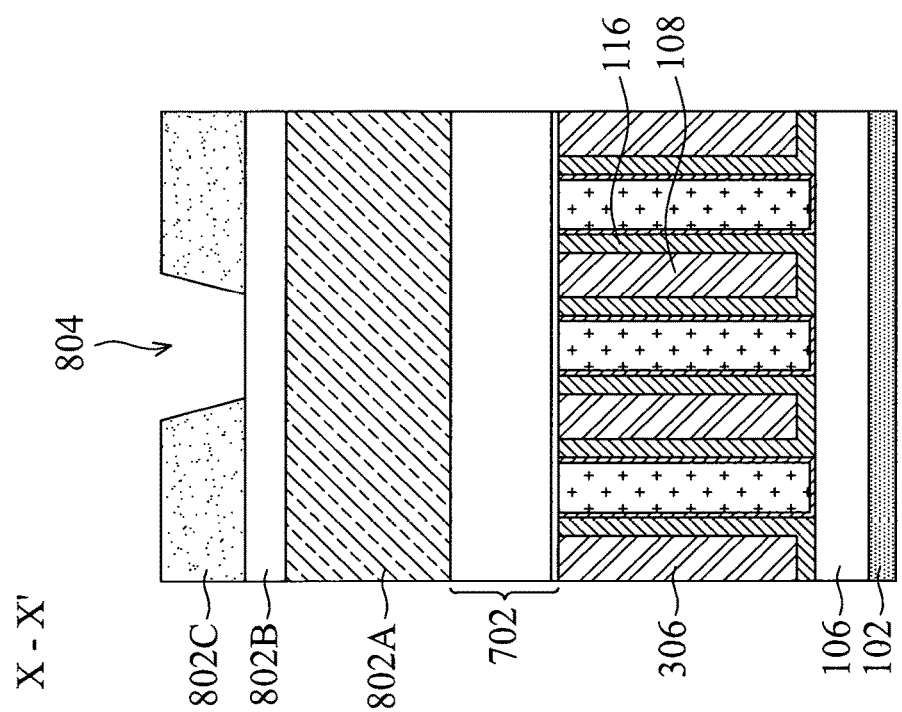

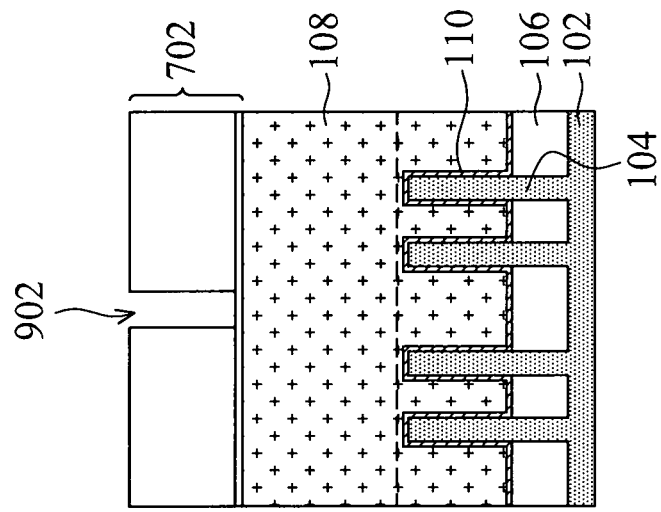
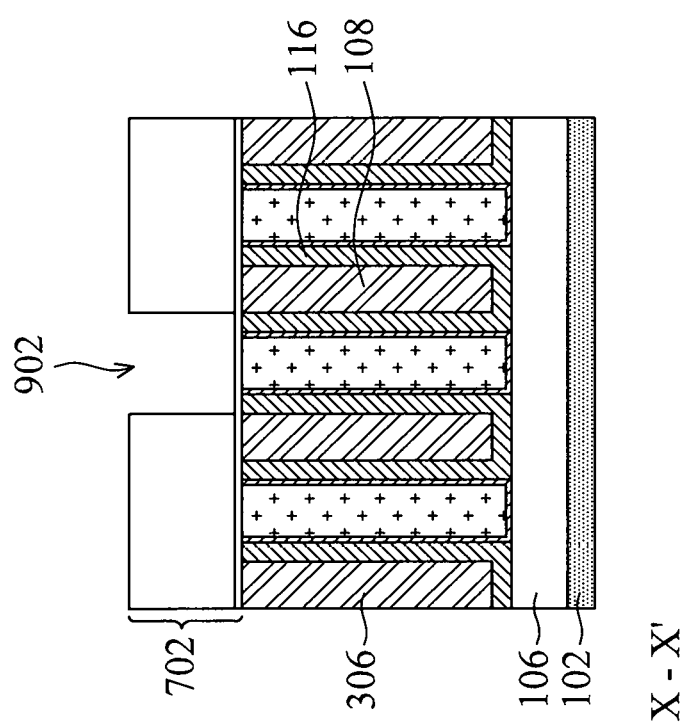
FIG. 9A
FIG. 9B

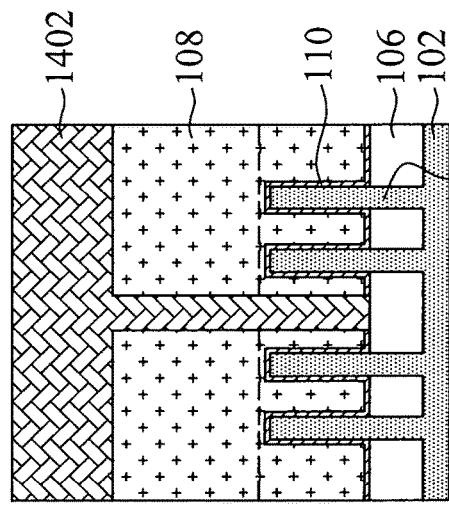
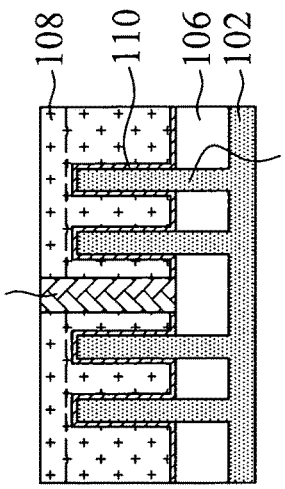
FIG. 13A
FIG. 13B
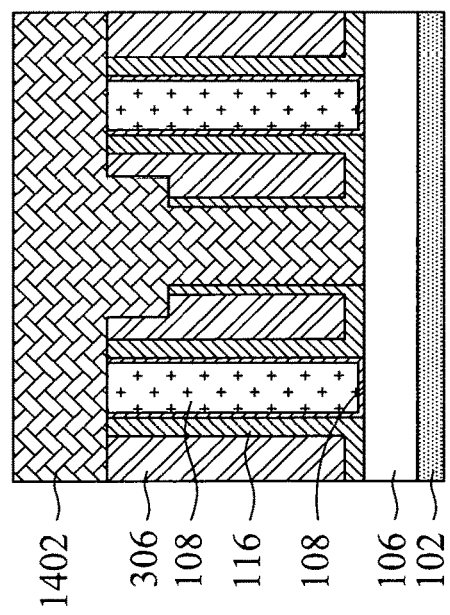
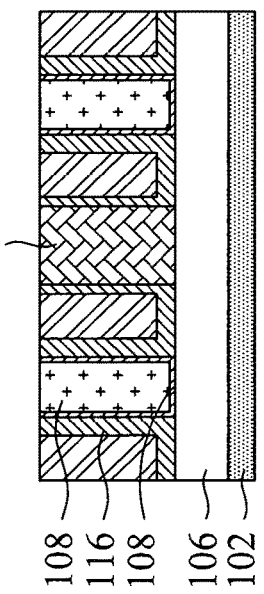
FIG. 14A
FIG. 14B

METAL GATE STRUCTURE AND METHODS OF FABRICATING THEREOF

CROSS-REFERENCE TO RELATED APPLICATION

This application claims the benefit of U.S. Provisional Application No. 62/586,658, filed Nov. 15, 2017, hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include a metal layer deposition followed by a subsequent metal layer cut process. In some cases, the metal gate line cut process may result in loss of portions of an inter-layer dielectric (ILD), undesired residue of the metal layer(s), and/or other issues including those that can lead to degraded device reliability.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A and FIG. 3B illustrate respective cross-sectional views of a FinFET structure, in which a metal gate line has been cut, in accordance with embodiments of the present disclosure;

FIGS. 6A, 7A, 8A, 9A, 10A, 11A, 12A, 13A, and 14A show cross-sectional views of a FinFET structure along a plane substantially parallel to a plane defined by section XX' of FIG. 1, and fabricated according to an embodiment of the method of FIG. 5;

FIGS. 6B, 7B, 8B, 9B, 10B, 11B, 12B, 13B, and 14B show cross-sectional views of the FinFET structure along a plane substantially parallel to a plane defined by section YY' of FIG. 1, and fabricated according to an embodiment of the method of FIG. 5.

DETAILED DESCRIPTION

Figure 1:
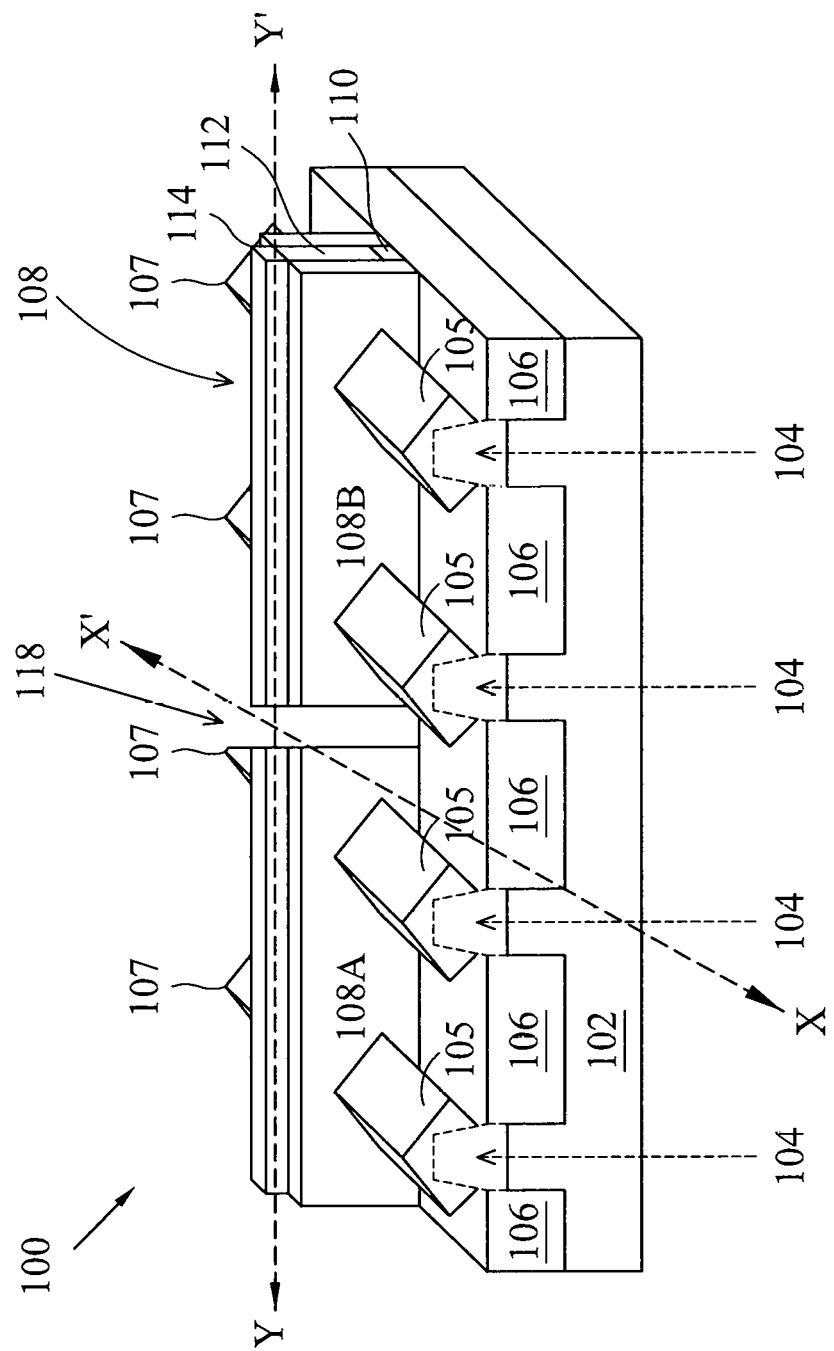
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. In other embodiments, a planar device may be fabricated using one or more of the structures or methods discussed herein.

It is also noted that the illustrated Figures are exemplary of portions of a device formed on a substrate, as such, in some examples two fins are illustrated, in others additional fins are illustrated, in some examples two gates are illustrated, in others a single gate or additional gates are illustrated. As understood by one of ordinary skill in the art, a plurality of gates and fins are typically present in a semiconductor device and thus, the quality of the gates or fins illustrated in the figures is for reference only and not intended to be limiting in its application.

The present application is generally related to a metal gate structure and related methods. In particular, the present disclosure is directed to a metal gate cut process and related structure. Metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include metal layer(s) deposition. Having formed metal gates extending across regions of the substrate, it may be necessary to "cut" or separate certain metal gate lines into segments isolated from one another to provide the transistor-level functionality required by the design. Thus, the formation of the metal gate electrode may be followed by a subsequent metal gate cut processes according to embodiments discussed herein.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, a metal gate cut process and related structures are provided. At least some embodiments of the present disclosure may be used to provide a profile of the cut gate segment and the opening achieved by the cut that allows for improved isolation between the now-cut segments of the metal gate structure. For example, in at least some existing processes, a profile may be provided that tapers such that it is difficult to achieve a suitable distance of separation between the cut gate segments as well as provides difficulties in subsequently filling the cut region with dielectric material. These difficulties can lead to an insufficient isolation effect between the cut gate segments. To mitigate one or more of the issues, the present disclosure provides cut metal gate processes and structures that can, in some embodiments, improve isolation between the cut gate segments.

Illustrated in FIG. 1 is a FinFET device 100. Various embodiments disclosed herein may be used to fabricate the FinFET device 100 and/or may be present in the final structure of the FinFET device 100. The FinFET device 100 includes one or more fin-based, multi-gate field-effect transistors (FETs). The FinFET device 100 includes a substrate 102, fin elements (or fins) 104 extending from the substrate 102, isolation regions 106, and a gate structure 108 disposed on and around some of the fins 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fins 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an extreme ultraviolet (EUV) lithography process or an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104 or portions thereof. A channel region of a transistor is disposed within the fin 104, underlying the gate structure 108. In some examples, the channel region of the fin 104 includes a high-mobility material such as germanium, as well as any of the compound semiconductors or alloy semiconductors discussed above and/or combinations thereof. High-mobility materials include those materials with an electron mobility greater than silicon.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having in some embodiments an interfacial layer formed over the channel region of the fin 104, a gate dielectric layer 110 formed over the interfacial layer, and at least one metal layer 112 formed over the gate dielectric layer 110. The interfacial layer may include a dielectric material such as silicon oxide layer (SiO$_2$) or silicon oxynitride (SiON). The interfacial layer may be formed by chemical oxidation, thermal oxidation, atomic layer deposition (ALD), chemical vapor deposition (CVD), and/or other suitable method. The gate dielectric layer 110 may include a high-k dielectric layer such as hafnium oxide (HfO$_2$). Alternatively, the high-k dielectric layer may include other high-k dielectrics, such as TiO$_2$, HfZrO, Ta$_2$O$_3$, HfSiO$_4$, ZrO$_2$, ZrSiO$_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 112 is representative of one or more metal compositions and may include a conductive layer such as W, TiN, TaN, WN, Re, Ir, Ru, Mo, Al, Co, Ni, combinations thereof, and/or other suitable compositions. In some embodiments, the metal layer 112 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. The metal layer 112 may include various layers in addition and including those providing the work function including, for example, barrier layers, seed layers, capping layers, fill layers, and/or other suitable compositions and functions including those discussed below. Thus, the metal layer 112 may provide a gate electrode for the FinFET device 100, including both N-type and P-type FinFET devices 100. The metal layer(s) 112 may be formed using PVD, CVD, electron beam (e-beam) evaporation, and/or other suitable process. In some embodiments, sidewall spacers 116 are formed on sidewalls of the gate structure 108. The sidewall spacers 116 may include a dielectric material such as silicon oxide, silicon nitride, silicon carbide, silicon oxynitride, or combinations thereof. A hard mask layer 114 (e.g., silicon nitride, etc.) may be disposed over regions of the metal layer(s) 112 of the gate structure 108.

It is noted that an interlayer dielectric (ILD) layer may be disposed on the substrate 102 including over the isolation regions 106 and source/drain regions 105/107. The ILD layer is not illustrated in FIG. 1 for ease of illustration of the other layers. As discussed below, a metal gate cut pattern (e.g., 210 of FIG. 2) provides for defining a region where a portion of the gate structure 108 is removed providing discontinuous cut metal gate segments (108A, 108B) of the gate structure 108. The removed portion of the gate structure within the metal gate cut pattern forms an opening 118. The opening 118 may be substantially as detailed below including with respect to the profile of FIGS. 3A, 3B, and 4. The opening 118 may subsequently be filled with insulating material, including as discussed in the examples below such as FIGS. 13A, 13B, 14A, 14B, and 14C.

Figure 2:
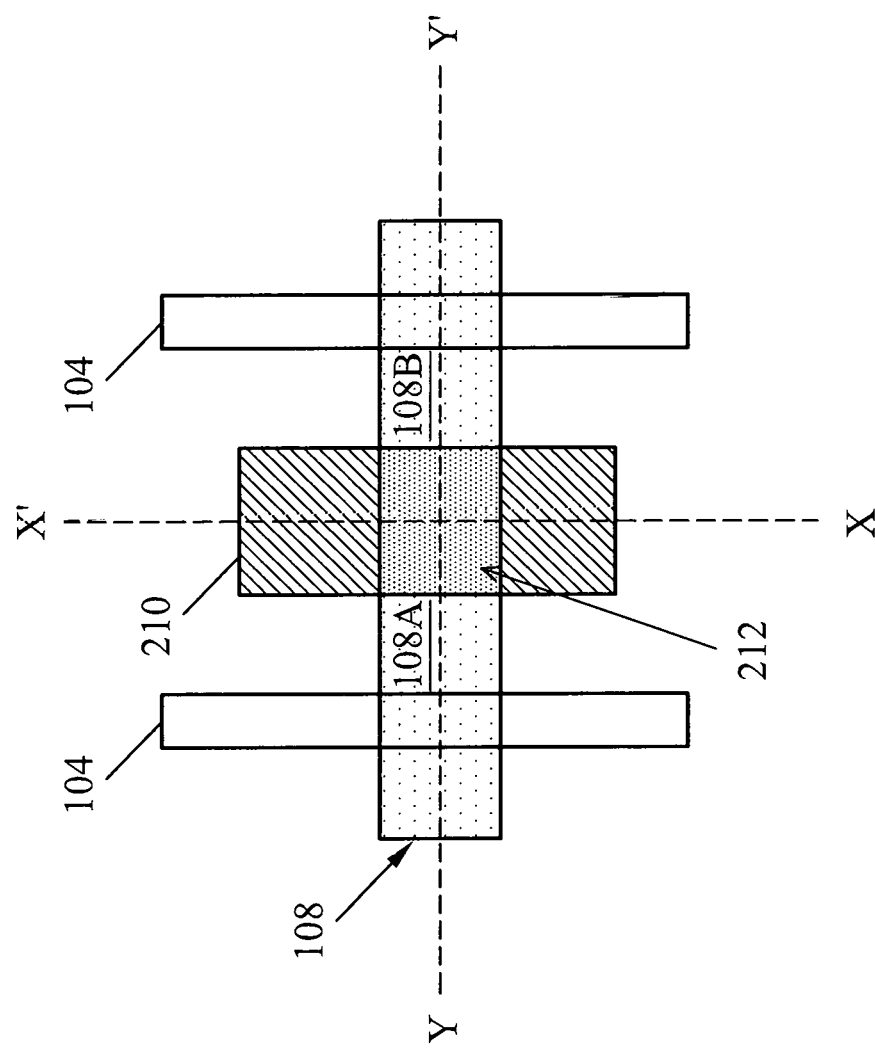
FIG. 2 is a top-view of neighboring fins, a metal gate structure, and a metal gate cut pattern, in accordance with some embodiments.

Referring now to FIG. 2, illustrated therein is a top-view of neighboring fins 104 and a metal gate structure 108 disposed over and substantially perpendicular to the fins 104. In some embodiments, section XX' of FIG. 2 may be substantially parallel to the plane defined by section XX' of FIG. 1, and section YY' of FIG. 2 may be substantially parallel to the plane defined by section YY' of FIG. 1. In some cases, the fins 104 may be substantially the same as fins 104 described above, and the metal gate structure 108 may be similar in at least some aspects to the gate structure 108 described above. By way of example, FIG. 2 shows a metal gate cut pattern 210, which in some examples may be defined by a patterned hard mask layer (including as discussed below). In some embodiments, the metal gate cut pattern 210 provides an opening (also referred to as a space or region interposing the segments of the metal gate structure), for example, in the patterned hard mask layer through which a metal gate line-cut process is performed. A portion 212 of a metal gate structure 108 under the opening may be cut such that the metal gate structure is removed from the substrate within the opening providing first and second portions of discontinuous metal gate structure segments (e.g., 108A, 108B) and an opening (e.g., 118) therebetween. In some embodiments, the metal gate cut pattern 210 (e.g., opening in the hard mask) is substantially rectangular in shape as illustrated in FIG. 2. In some embodiments, the metal gate cut pattern 210 has a defined rectangular shape, while the resultant opening (or region) 118 (see FIGS. 1, 3A, 3B, and 4) formed using said shaped pattern 210 may not be rectangular but have the profiles discussed below. In some embodiments, the profile of the opening 118 is defined by the etching processes used in conjunction with the metal gate cut pattern 210. A metal gate cut process, as described herein, may include a dry etch process, a wet etch process, or a combination thereof as discussed in detail below, which is used to remove a portion of the metal gate structure 108 within an area defined by the metal gate cut pattern 210. By way of example, the metal gate line-cut process may be used to cut a metal gate line into separate, electrically disconnected and discontinuous line segments 108A and 108. In some embodiments, a dielectric layer may be formed within a line-cut region (e.g., where the portion of the metal gate layer has been removed, opening 118 of FIG. 1) as part of the metal gate line-cut process. As illustrated the metal gate cut pattern 210 may overlay an isolation region disposed on the substrate, such as isolation regions 106 of FIG. 1. However, in other embodiments, a metal gate cut pattern 210 may overlie a fin such as fin 104, for example, where the fin 104 underlying the metal gate cut pattern 210 is a dummy fin in whole or in part.

With reference to FIG. 3A, illustrated is a cross-sectional view of a portion of the FinFET structure 100, along a plane substantially parallel to a plane defined by section YY' of FIG. 1 and/or FIG. 2. With reference to FIG. 3B, illustrated therein is a cross-section view of a portion of the FinFET structure 100, along a plane substantially parallel to a plane defined by section XX' of FIG. 1 and/or FIG. 2. The FinFET structure 100 includes the metal gate structure 108 that has been cut (108A, 108B). The metal gate structure 108 may be cut in accordance with some embodiments discussed herein including with respect to FIG. 5. The FinFET structure 100 may include one or more of the features described above with reference to the FIGS. 1 and 2 such as fin elements 104 extending from a substrate 102, isolation regions 106, and the gate structure 108 disposed on and around the fin-elements 104. The gate structure 108 may be substantially similar to the gate structure 108 of FIG. 1 and/or FIG. 2 discussed above. The gate structure 108 may be a metal gate structure such as including a gate stack having a gate dielectric layer and metal layer(s) formed over the gate dielectric layer. In some examples, the metal layer may include a plurality of metal materials including, for example, a first metal material (e.g., such as a P-type work function metal (PWFM)), a second metal material (e.g., such as an N-type work function metal (NWFM)) over the first metal material, and a third metal material (e.g., such as fill metal (e.g., tungsten)) over the second metal material and so forth. Hard mask layers 302 and 304 are disposed over the gate structure 108. Hard mask layers 302 and/or 304 may be substantially similar to hard mask layer 114 illustrated above in FIG. 1. In an embodiment, hard mask layer 302 includes silicon nitride. In an embodiment, layer 304 includes titanium nitride (TiN). However, other suitable compositions are possible.

FIG. 3A further shows a metal gate cut region 210 defined by the hard mask layers 304, 302. Under this opening, defining the metal gate cut region 210, the gate structure 108 is "cut" such that it is discontinuous and an opening 118 is formed therebetween. The "cut" may be formed as part of a metal gate line-cut processes as described herein including with respect to FIG. 5. In various cases, at a subsequent processing step, a dielectric layer may be formed within the region of the opening 118 and interposing the gate segments 108A, 108B. The dielectric layer may be a different dielectric composition than material of the isolation regions 106 and/or the dielectric material of the adjacent ILD layer, discussed below.

It is noted that the metal gate cut region 210 provides an opening 118 (also referred to as trench) that extends to or into the STI 106. In an embodiment, the opening 118 extends a distance D1 from a top surface of an uppermost metal layer of the metal gate structure 108 to a bottommost point of the opening 118. D1 may be between approximately 150 nanometers (nm) and 180 nm. The distance D1 of the opening is greater than T1, which is the thickness of the metal gate including gate dielectric 110 and the plurality of metal layers overlying the gate dielectric 110. As illustrated in the embodiment of FIG. 3A, the opening 118 extends into the STI 106. The opening 118 may extend into the STI 106 by a distance D2. The distance D2 may be between approximately 30 nm and 70 nm. In an embodiment, the depth D2 is at least approximately 45% of the thickness T2 of the STI 106. The over-etch (e.g., 45% over etch (OE)) can be provided to mitigate a risk of residue of the metal gate structure 108 in the opening 118 of the metal gate cut region 210.

In an embodiment, the profile of the opening 118 defined by the metal gate cut region 210 has substantially linear sidewalls 308. The substantially linear sidewalls 308 are substantially perpendicular to a top surface of the substrate 102. The term "substantially" as provided herein means the sidewalls are within about 10% of perpendicular to a top surface of the substrate 102 throughout the thickness T1 of the metal gate 108. It is noted that generally within the present application terms such as "substantially" or "about" are to be construed as one of ordinary skill in the art would recognized, within reasonable tolerance of manufacturing control (e.g., 10%).

In an embodiment, the profile of the opening 118 has a width W1 at a top portion of the opening and a width W4 at a bottom portion of the opening. In a further embodiment, W1 is measured at a top surface of an uppermost metal layer of the metal gate structure 108. In a further embodiment, W4 is measured a top surface of the isolation 106 that underlies a portion of the gate 108. W4 may be greater than W1. In an embodiment, W4 is at least 10% greater than W1. W4 may be between about 15 nm and 25 nm and W1 may be between 10 nm and 30 nm. In a further embodiment, a width of the opening 118 lying between the measurements of W1 and W4 may be smaller than W1. In some embodiments, W1 and/or a width measured in the opening 118 adjacent the gate (a width from sidewalls of the metal gate 108A to metal gate 108B) may be approximately 20% smaller (nm) than W2.

Figure 4:
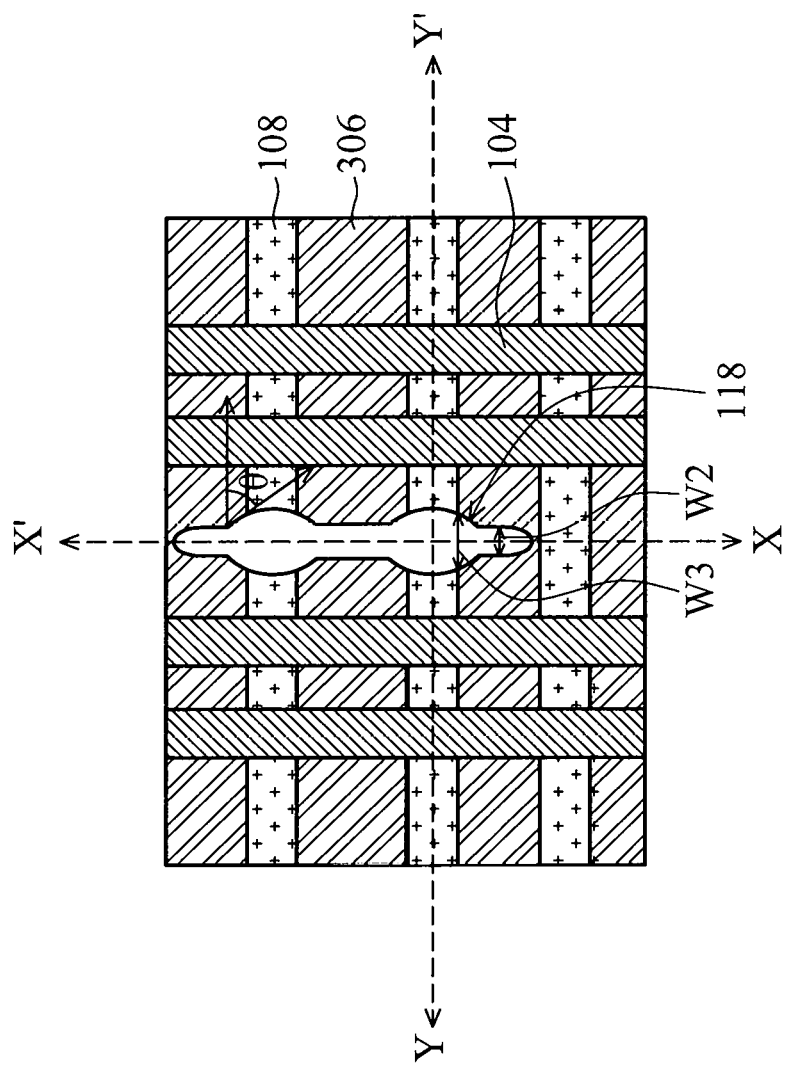
FIG. 4 illustrates a top view of a FinFET structure, in which a metal gate line has been cut, in accordance with embodiments of the present disclosure.

In some embodiments, the profile of the opening 118 may also be characterized as having an angle $\Theta$ as illustrated in FIG. 4. The angle $\Theta$ may be less than approximately 45 degrees. The angle $\Theta$ as illustrated in FIG. 4 is measured as the angle between the sidewall of the opening 118 and a horizontal plane parallel to a sidewall of the gate structure 108 (perpendicular to the direction of the fin 104).

FIG. 3B shows the opening 118 of the metal gate cut region 210 from an XX' of FIG. 1. The ILD layer (discussed above) is illustrated as ILD 306. The ILD layer 306 may be formed by chemical vapor deposition (CVD) or other suitable deposition processes and in some embodiments, may be planarized after deposition. The ILD layer 306 may include, as non-limiting examples of its composition, silicon dioxide, silicon nitride, silicon oxynitride, carbon containing dielectrics, TEOS, and combinations of these, and may be low-k, high-k or oxide dielectric, and may be formed of other known materials for ILD layers. It is noted that the ILD layer 306 is illustrated as a single layer but the device would typically also include other dielectric materials such as additional spacer elements, etch stop layers, and the like. It is noted that the opening 118 extends to a top surface of the STI 106, in some embodiments, the opening 118 extends into the STI 106 as discussed with reference to FIG. 3A.

FIG. 4 illustrates a top view of a portion of an exemplary device such as the FinFET device 100 of FIG. 1. The illustrated fins 104, metal gate structures 108, and ILD 306 may be substantially similar to as discussed above. The opening 118 (defined by the metal gate cut region 210 discussed above) has profile in the top view which includes a width W3 and a width W2. The opening has a greater width W3 collinear with the metal gate structure 108. In other words, the opening 118 at the portion of the metal gate cut region 210 where the metal gate structure was removed has a width that is greater than that of the opening 118 at the portion of the metal gate cut region 210 adjacent to but a spaced from the metal gate structure—in other words, the dielectric region surrounding the gate 108 such as, ILD 306 (FIG. 3B). This may be due to the etching process(es) of the metal gate cut process discussed below. In an embodiment, the opening 118 has substantially curvilinear sidewalls extending from the greater width (e.g., W3) to the narrower width (e.g., W2) portion. As illustrated, W3 of FIG. 4 corresponds to (e.g., is equal to) W1 from the YY' cut of FIG. 3A.

Figure 5:
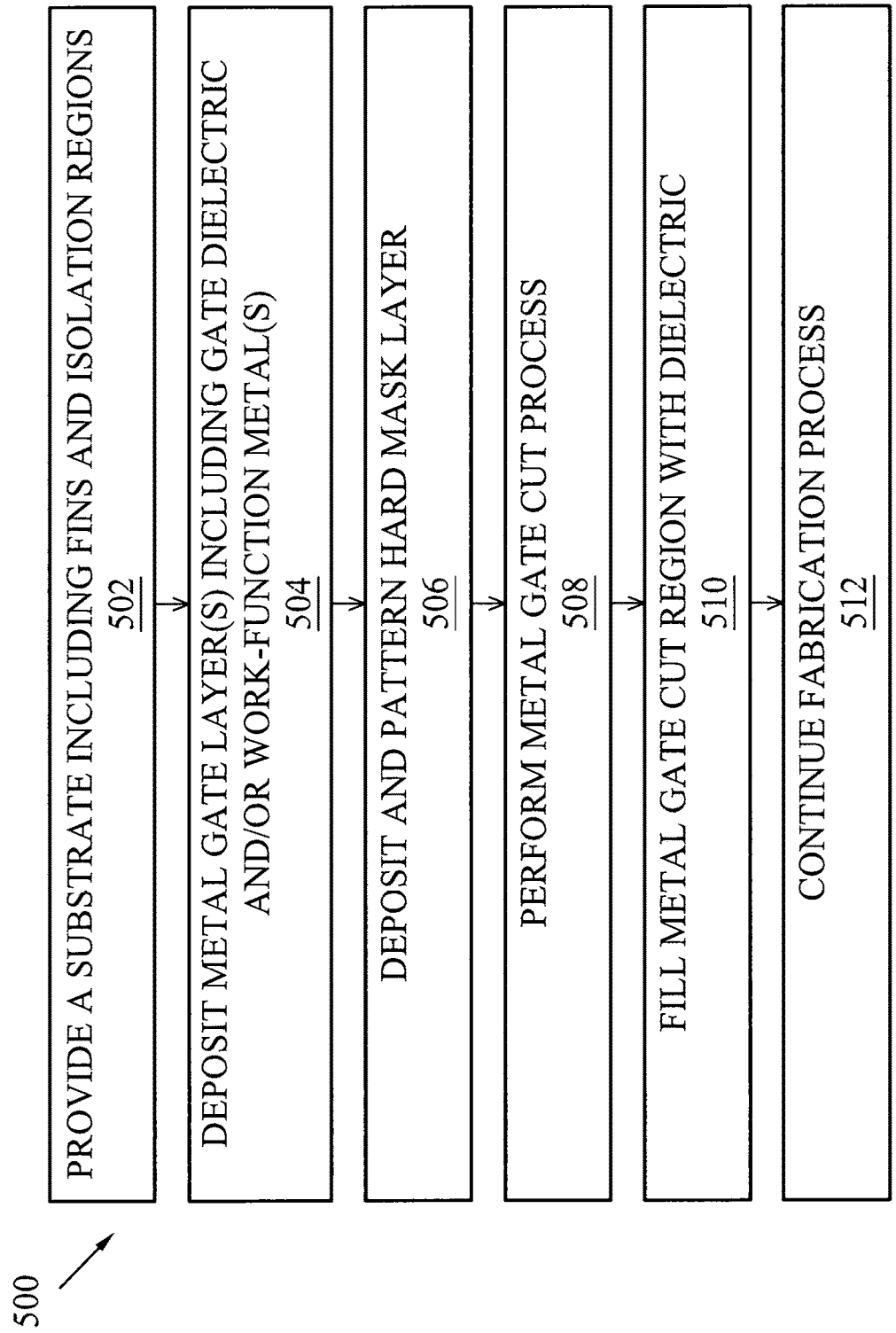
FIG. 5 is a flow chart of a semiconductor manufacturing method, according to one or more aspects of the present disclosure.

With reference now to FIG. 5, shown therein is a flow chart of a semiconductor manufacturing method 500, according to at least some embodiments. Additional steps may also be provided before, during, and after the method 500, and some steps described can be replaced, eliminated, or moved before or after other steps for additional embodiments of the method. It is also noted that the method 500 is exemplary, and is not intended to limit the present disclosure beyond what is explicitly recited in the claims that follow. The method 500 will be further described below in conjunction with FIGS. 6A, 6B, 7A, 7B, 8A, 8B, 8C, 9A, 9B, 10A, 10B, 10C, 11A, 11B, 12A, 12B, 12C, 13A, 13B, 14A, 14B, and 14C. FIGS. 6A, 7A, 8A, 9A, 10A, 11A, 12A, 13A, and 14A show cross-sectional views of a FinFET structure 600 along a plane substantially parallel to a plane defined by section XX' of FIG. 1, and FIGS. 6B, 7B, 8B, 9B, 10B, 11B, 12B, 13B, and 14B show cross-sectional views of the structure 600 along a plane substantially parallel to a plane defined by section YY' of FIG. 1.

In various embodiments, the method 500 begins at block 502 where a substrate including fins and isolation regions is provided. With reference to the example of FIGS. 6A and 6B, and in an embodiment of block 502, an illustrative structure 600 is shown. The substructure 600 may be part of a FinFET structure such as FinFET structure 100. The structure 600 may include one or more of the features described above with reference to the FIG. 1 such as fin elements 104 extending from a substrate 102, isolation regions 106, sidewall spacers 116 abutting a metal gate structure 108, and an ILD layer 306.

In some embodiments, the method 500 provides the metal gate structure 108 through a replacement gate process where a dummy gate (e.g., polysilicon) is formed over the fin and is subsequently removed to form a trench within which the metal gate structure 108 is formed. The trench may be defined by spacer elements such as spacer elements 116.

The method 500 then proceeds to block 504 where a metal gate structure is formed on the substrate 102. The metal gate structure may be formed in the trench provided by the removal of the dummy gate. The metal gate structure may include a plurality of layer(s) including one or more of an interfacial layer, a gate dielectric layer, work function layer(s), barrier layer(s), adhesion layer(s), diffusion layer(s), a metal fill layer, and/or other suitable layers formed within the trench.

Figure 6B:
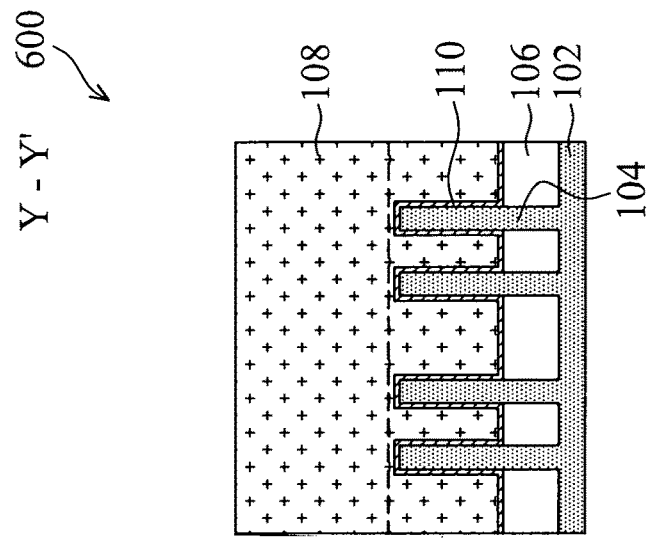
Figure 6A:
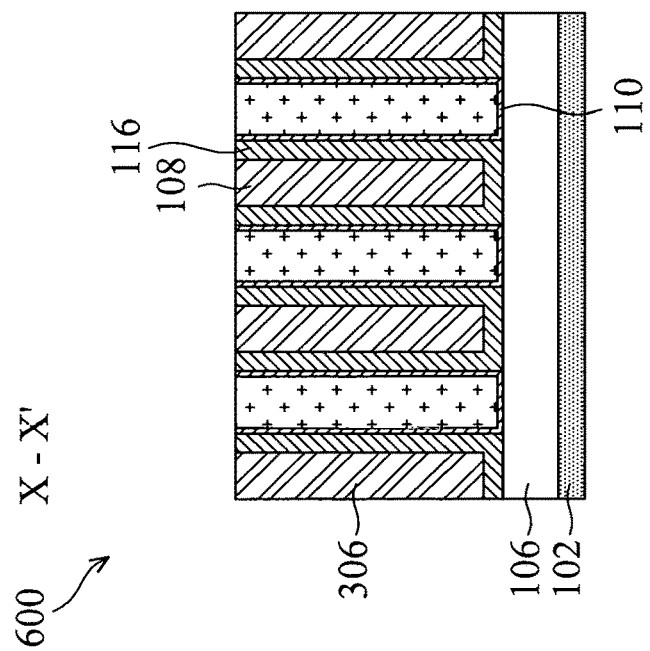

Referring to the example of FIGS. 6A and 6B, a metal gate structure 108 is formed on the substrate 102 including over and on sidewalls of fins 104. The metal gate structure 108 has a gate dielectric layer 110 and overlying metal layer(s).

In some embodiments, the overlying metal layer(s) of the metal gate structure 108 may include one or more work function layers. In some embodiments, a work function metal layer includes a p-type work function metal (PWFM). Merely by way of example, the PWFM layer may include Ni, Pd, Pt, Be, Ir, Te, Re, Ru, Rh, W, Mo, WN, RuN, MoN, TiN, TaN, WC, TaC, TiC, TiAlN, TaAlN, or combinations thereof. In various embodiments, the PWFM layer may be formed using PVD, CVD, electron beam (e-beam) evaporation, and/or other suitable process. The metal gate structure 108 may additionally or alternatively include a work function layer of a metal layer including an n-type work function layer (NWFM) which may include, by way of example, Ni, Pd, Pt, Be, Ir, Te, Re, Ru, Rh, W, Mo, WN, RuN, MoN, TiN, TaN, WC, TaC, TiC, TiAlN, TaAlN, or combinations thereof. In various embodiments, the NWFM layer may be formed using PVD, CVD, electron beam (e-beam) evaporation, and/or other suitable process. In some embodiments, a fill metal layer, barrier layer(s), diffusion layers, and/or other suitable layers are included in the plurality of layers of the metal gate structure. Exemplary metal layers of the metal gate structure 108 may include other metals such as Ni, Pd, Pt, Be, Ir, Te, Re, Ru, Rh, W, Mo, WN, RuN, MoN, TiN, TaN, WC, TaC, TiC, TiAlN, TaAlN, or combinations thereof.

The metal gate structure 108 also includes a gate dielectric layer 110 (and in some cases an underlying interfacial layer) under the metal layers of the metal gate structure 108. The gate dielectric layer 110 may include a high-k dielectric such as hafnium oxide. Any one or more of these layers of the metal gate structure 108 may be formed using atomic layer deposition (ALD), physical vapor deposition (PVD), CVD including plasma enhanced CVD, and/or other suitable deposition processes. It is noted that the method 500 may include one or more chemical mechanical polishing (CMP) processes are performed during the formation of the metal gate structure.

The method 500 proceeds to block 506 where a hard mask layer(s) is deposited on the substrate and patterned to provide openings defining the metal gate cut region. The hard mask layer may be one or more layers disposed over the substrate 102 and the gate structure 108. In some embodiments, the hard mask layer may include a patterned silicon nitride (SiN) layer. In a further embodiment, the hard mask layer may include a patterned silicon nitride (SiN) layer and an underlying titanium nitride (TiN) layer. Alternatively or additionally, in some embodiments, the hard mask layer may include a other dielectric materials such as silicon oxynitride, silicon carbide, or other suitable material.

Figure 7B:
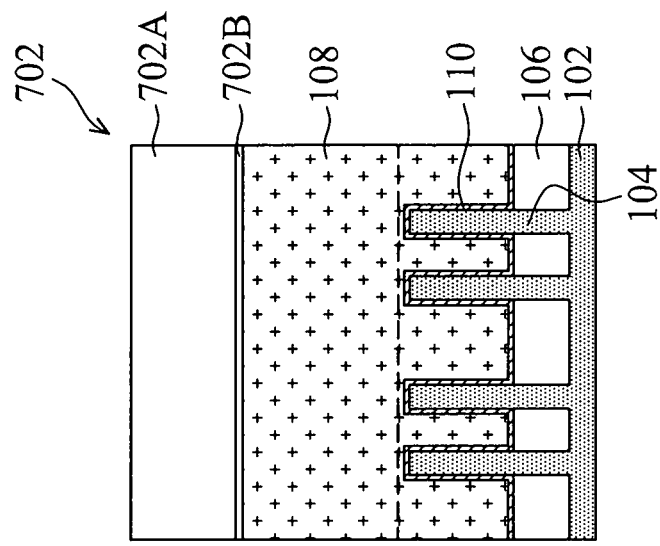
Figure 7A:
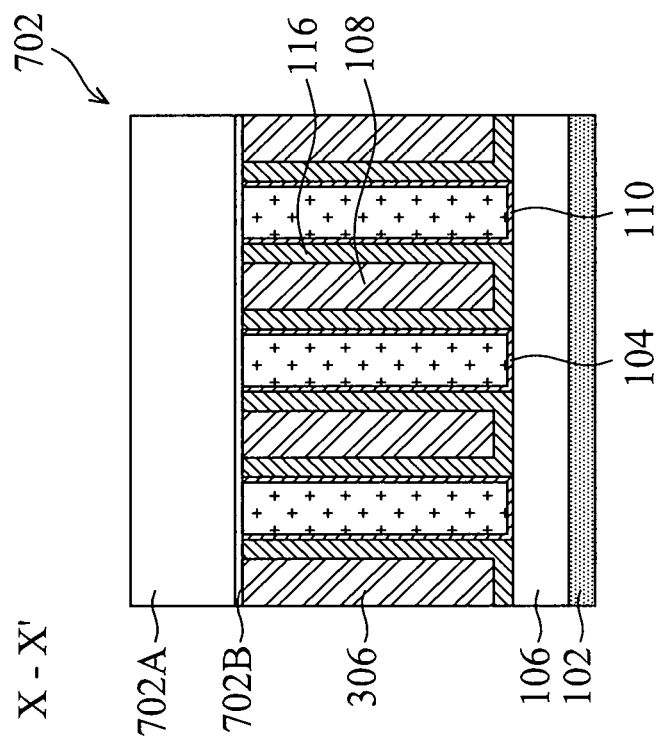

With reference to the example of FIGS. 7A and 7B, a hard mask layer stack 702 is deposited. The hard mask layer stack 702 includes a first layer 702A and a second layer 702B. In an embodiment, the first layer 702A includes silicon nitride and the second layer 702B includes titanium nitride. In some embodiments, the hard mask layer stack 702 may be formed by atomic layer deposition (ALD) or other suitable deposition method. In some embodiments, the hard mask stack 702 may be between approximately 25 nm and 100 nm in thickness.

With reference to the example of FIGS. 8A and 8B, a patterning layer is formed over the hard mask layer stack 702. The pattern of the patterning layer may be subsequently transferred to the hard mask layer stack 702. As illustrated in FIGS. 8A and 8B, a patterning layer of a tri-layer resist 802 is formed over the substrate 102. The tri-layer resist 802 may include a bottom layer 802A, a middle layer 802B, and an upper layer 802C. In an embodiment, the upper layer 802C is a photoresist within which a pattern is exposed and developed using suitable lithography techniques. As illustrated in FIGS. 8A and 8B, an opening 804 is formed in the patterning layer(s). The opening 804 may be defined to provide the metal cut gate region 210 discussed above. The opening 804 may define a region (e.g., rectangular in shape) under which a metal gate line-cut is to be performed. It is noted that a single opening 804 may extend over a plurality of metal gates that are to be "cut." Additionally, it is noted that a plurality of openings 804 may be formed simultaneously over the substrate 102.

With reference to the example of FIGS. 9A and 9B, the pattern formed in the resist 802 is transferred to the hard mask layer stack 702 forming an opening 902 in the hard mask layer stack 702. The opening 902 may expose one or more metal gate structures 108 that are to be cut, or removed in part, from the substrate. The opening 902 may correspond to the cut metal gate pattern 210, discussed above. The opening 902 may be formed by suitable etching processes (e.g., hard mask opening) processing including, for example, plasma etching.

Figure 10B:
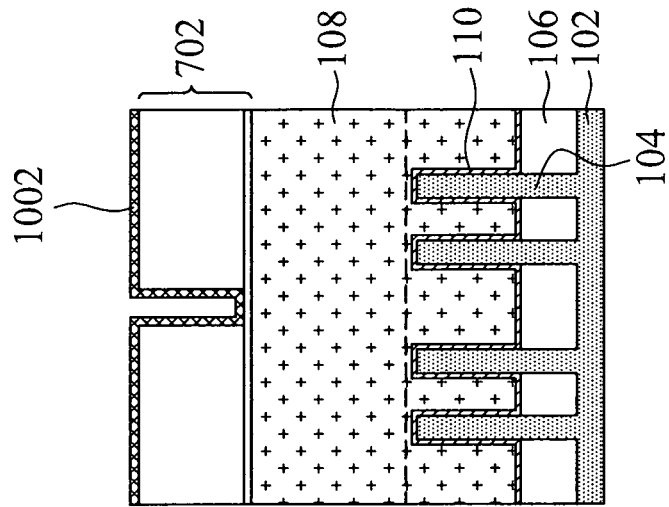
Figure 10A:
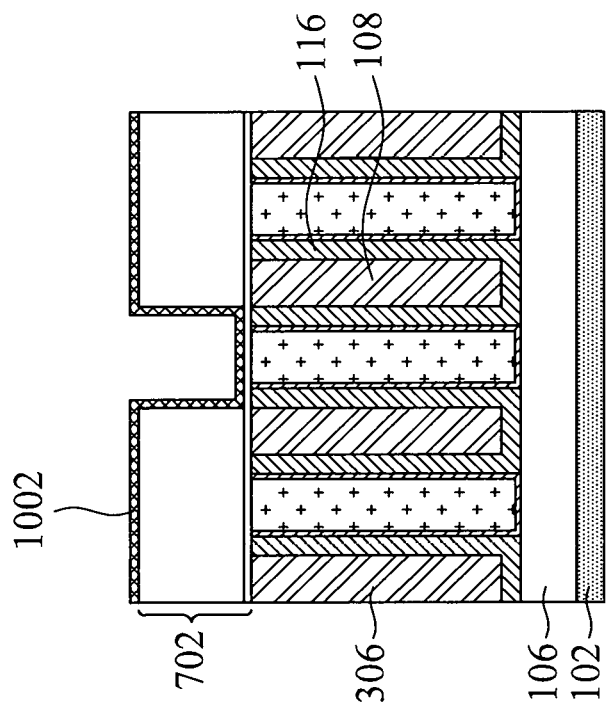
Figure 11B:
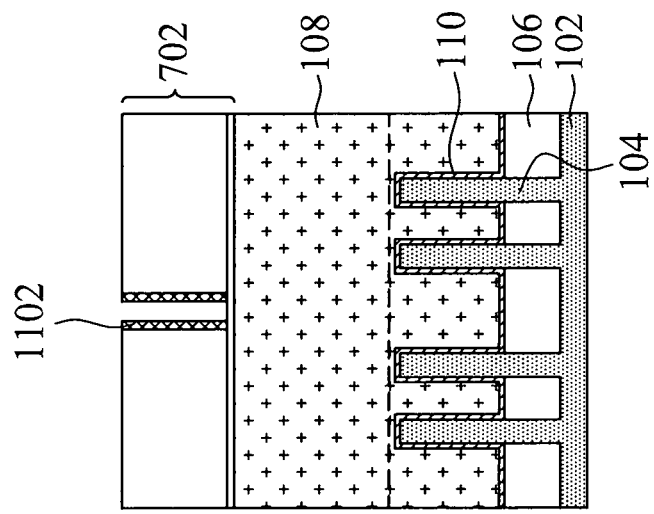
Figure 11A:
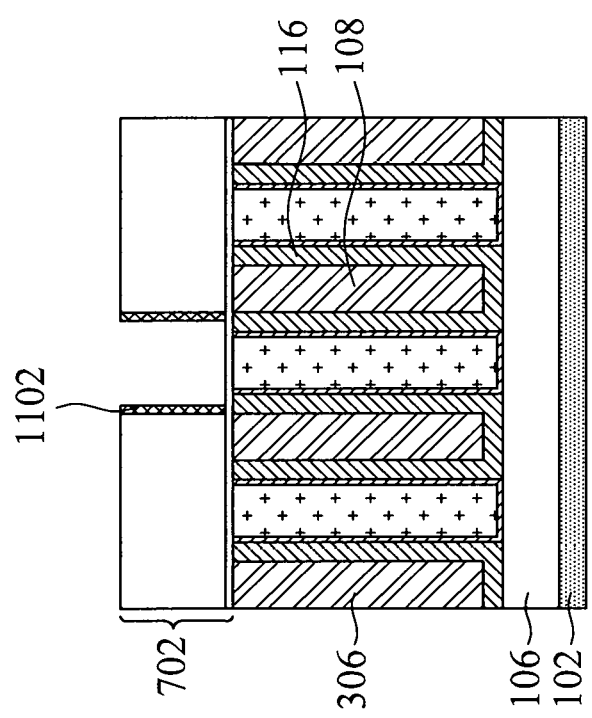

In some embodiments, after the forming of the opening 902 in the hard mask layer stack 702, a re-deposition process is performed as illustrated in FIGS. 10A and 10B. The re-deposition process may include atomic layer deposition (ALD). In some embodiments, the re-deposition process includes depositing a same material as provided in the layer 702A. For example, in some embodiments, silicon nitride is deposited in the re-deposition process, while the layer 702A also includes silicon nitride. In an embodiment, less than 10 nanometers (e.g., 5 nm, 4 nm, 3 nm) may be re-deposited onto the hard mask layer stack 702 forming re-depositing layer 1002. After the re-deposition process, a hard mask open (HMO) process may be performed to remove the re-depositing layer 1002 from the bottom of the opening 902, while maintaining the re-depositing layer 1002 on the sidewalls of the opening 902 as illustrated in FIGS. 11A and 11B. The opening provided by FIGS. 11A and 11B may be substantially similar to the metal gate cut region 210. For example, the opening 902 may be substantially rectangular in shape and expose portions of one or more gates structures 108 that are to be cut.

It is noted that the above process of forming the opening in the hard mask layer stack 702 may include various other processes typical of semiconductor fabrication including photoresist stripping and/or de-scumming, inspections, cleanings, measurements, and/or other suitable processes. After the performance of block 506 including one or more of the steps discussed above, the hard mask layer disposed over the gate structure including an opening defining the gate cut region similar to the metal gate cut region 210 described above. The hard mask layer and associated opening is then operable to be used as a masking element in the subsequent gate cut etching processes discussed below.

The method 500 then proceeds to block 508 where a metal gate line-cut process is performed while using the patterned hard mask as a masking element. In some embodiments, the metal gate line-cut process includes a plurality of deposition and etch steps in sequence. It is noted that the aspect ratio of the opening to be formed may be greater than 10. For example, using FIG. 3A as illustrative, the depth of the opening (D1) may be between approximately 140 and 170 nm, while the width W1 of the opening may be 10% of D1. Because of this aggressive aspect ratio, deposition may be performed in conjunction with the removal etching to accurately control the profile of the resulting opening (e.g. 118).

In an embodiment, the cut metal gate process includes a first process series followed by a second process series. In some embodiments, the first process series is performed a plurality of times before the second process series is performed a plurality of times. In an embodiment, the first process series is performed six (6) times before the second process series is performed. In some embodiments, the second process series is performed a plurality of times after the first process series is performed (e.g., a plurality of times). For example, in an embodiment, the second process series is performed eight (8) times. Thus, for example, in an embodiment, the first process series is performed six (6) times followed the performance of the second process eight (8) times.

First Process Series of Cut Process: In an embodiment, the first process series may be performed by a dry etching equipment. In an embodiment, the first process series includes one or more of the following steps:

| Step Type | Primary Exemplary Process Gases | Step Number in Exemplary First Process Series |
|---|---|---|
| Deposition | SiCl4, HBr, He | 1 |
| Breakthrough etch step | CF4/C4F6, He/Ar | 2 |
| Metal (work function) Etch | SiCl4, BCl3, Cl2, He | 3 |
| Controlled Dep Step | CH4, O2 | 4 |

In an embodiment, the deposition step above may provide for deposition of a silicon based layer on sidewalls of the opening. Exemplary layers formed include SiOC and Silicon oxide ($SiO_2$). Exemplary process conditions include:
power—500-1500 Watts (W)
duration—3-8 seconds (s)
process temperature—80-120 Celsius (C)
pressure—5 to 15 mTorr (mT)
flow rate—50 to 100 sccm In an embodiment, the breakthrough etch step provides for etching through any oxide formed on the forming opening. Exemplary process conditions include:
power—50-250 W
duration—5-30 s
process temperature—80-120 C
pressure—5-15 mT
flow rate—10-150 sccm The Metal (work function) Etch may include an etch chemistry that is selective to the metal gate structure layer(s) to be etched, while minimizing etching of the surrounding dielectric (e.g., STI 106, ILD 306, spacer 116). In addition to the examples above, the Metal Etch process may include other chlorine-containing gases (e.g., Cl2, CHCl3, CCl4, and/or BCl3), bromine-containing gas (e.g., HBr and/or CHBr3), iodine-containing gas, other suitable gases and/or plasmas, and/or combinations thereof. Exemplary process conditions include:
power—1000-2000 W
duration—20-50 s
process temperature—80-120 Celsius (C)
pressure—5-15 mT
flow rate—500-1000 sccm With respect to the final step of the first process series above, Controlled Dep Step, the step may provide a polymer deposition that in conjunction with the other steps can control the profile of the resultant opening. For example, CH4 along with O2 can provide a C—H polymer deposition step with control capability (e.g., amount of deposition controlled by O2 ash provided within this step). In some embodiments, this controlled deposition can prevent or mitigate a bowing profile. With respect to the first process series above, O2 can contribute to cut metal gate critical dimension control by metal oxidation. The Controlled Dep Step may alternatively include other etch chemistries such as C2H4, SO2. Exemplary process conditions include:
power—300-800 W
duration—5-20 s
process temperature—80-120 deg.
pressure—5-30 mTorr
flow rate—100-300 sccm Second Process Series of Cut Process: In an embodiment, the second process series may also be performed by a dry etching equipment. The second process series may be performed in a same etcher as the first process series. In an embodiment, the second process series includes one or more of the following steps:

| Step Type | Primary Exemplary Process Gases | Step Number in Second Process Series |
|---|---|---|
| Deposition | Primary Exemplary Process Gases SiCl4, HBr, He | 1 |
| Breakthrough etch step | Primary Exemplary Process Gases CF4, He | 2 |
| Metal (Work Function) Etch | Etch Characteristics High Bias and High Duty Cycle | 3 |
| Controlled Dep Step | Primary Exemplary Process Gases CH4, O2 | 4 |

In an embodiment, the deposition step may be substantially similar to as discussed above with reference to the First Process Series.

In an embodiment, the breakthrough etch step may be substantially similar to as discussed above with reference to the First Process Series.

The Metal (work function) Etch may include a plasma etch with a high bias power. High bias power including powers over 1500 W and a bias voltage over 60V. In an embodiment, the Metal (work function) Etch may include a plasma etch having a high duty cycle. High duty cycles include duty cycles greater than 25%. In some embodiments, the duty cycle frequency ranges between about 50 Hz (Hertz) and 150 Hz.

The Metal (work function) Etch may include an etch chemistry that is selective to the metal gate structure layer(s) to be etched, while minimizing etching of the surrounding dielectric (e.g., STI 106, ILD 306, spacer 116). The Metal Etch process may include other chlorine-containing gases (e.g., Cl2, CHCl3, CCl4, and/or BCl3), bromine-containing gas (e.g., HBr and/or CHBr3), iodine-containing gas, other suitable gases and/or plasmas, and/or combinations thereof.

duration—10% to 50%
frequency—50 Hz to 150 Hz
etch chemistry—He/Cl2/SiCl4/BCl3
process temperature—80-120 deg.
pressure—5-15 mTorr
flow rate—500-1000 sccm The Controlled Dep Step (e.g., CH4, O2) may be substantially similar to as discussed above with reference to the First Process Series.

Figure 12B:
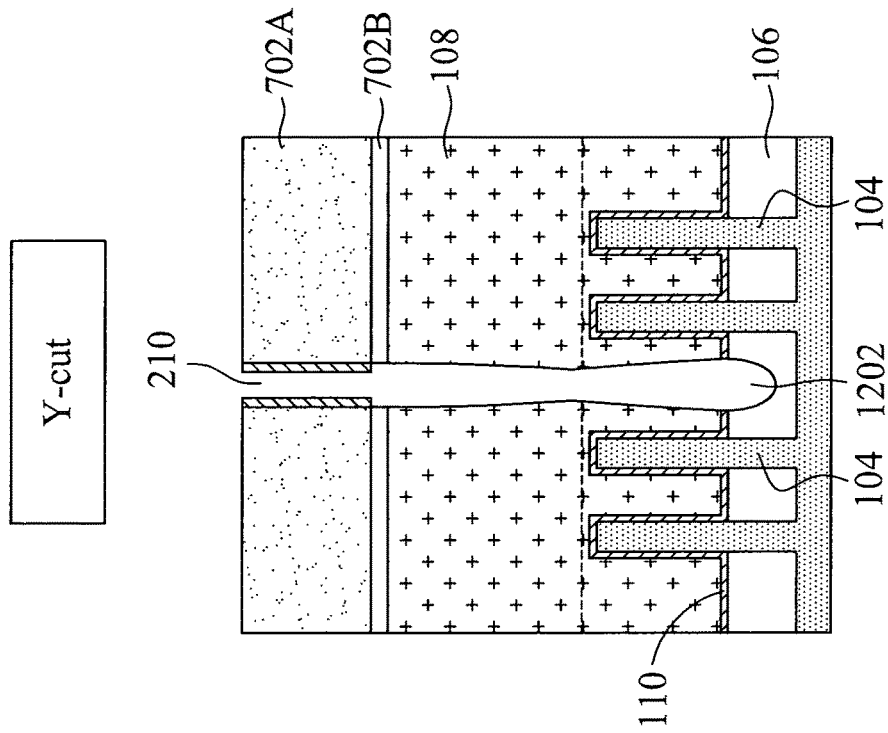
Figure 12A:
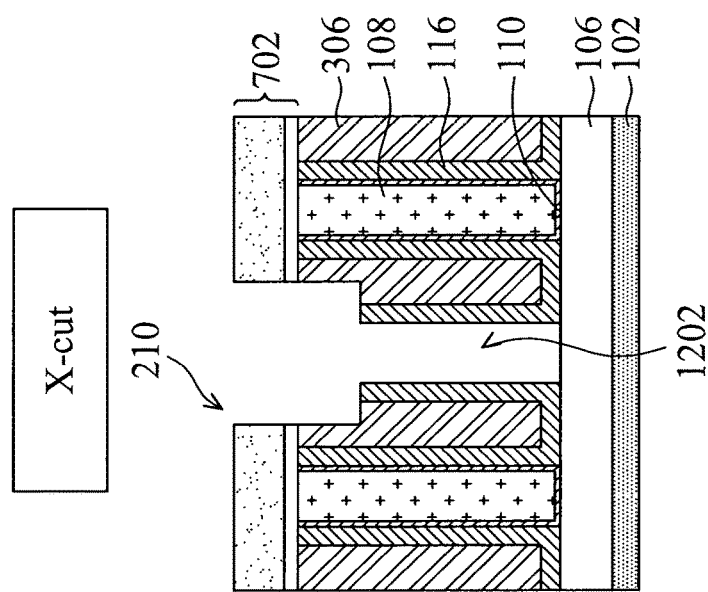
Figure 12C:
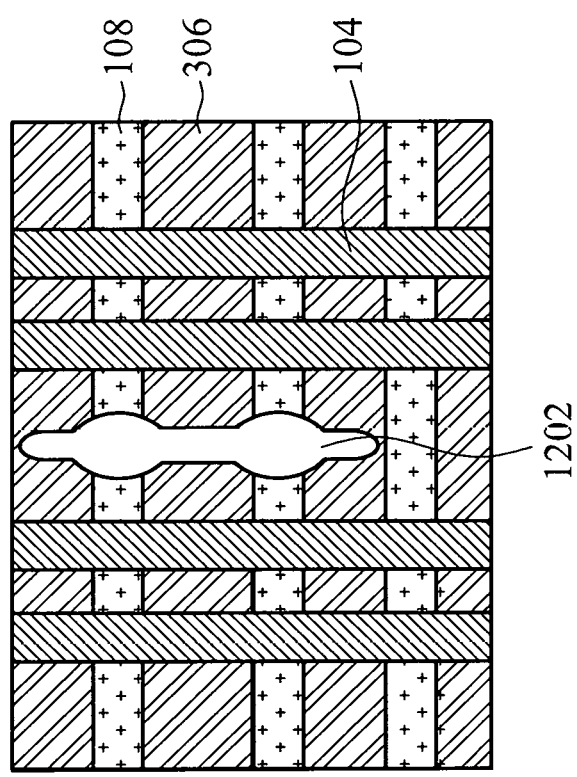
FIGS. 12C and 14C show top views of the FinFET structure such as provided in FIG. 1, and fabricated according to an embodiment of the method of FIG. 5.
Figure 14C:
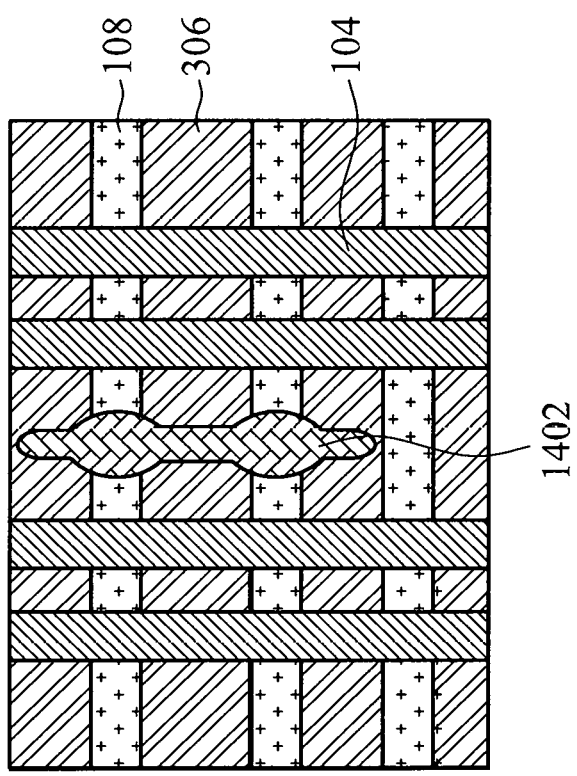

In some embodiments, the performance of the First Process Series and the Second Process Series of steps provides for the profile of the opening in the metal gate cut region such as illustrated in exemplary FIGS. 12A, 12B, and 12C. The opening 1202 may be substantially similar to the opening 118, described above with reference to FIGS. 1, 3A, 3B, and 4. For example, the same profile including dimensional relationships of W1, W2, D1, D2, T1, and T2 may also apply to the device 600 of FIGS. 12A, 12B, and 12C. In an embodiment, the angle $\ominus$ may be substantially similar to as discussed above. It is noted that FIG. 12C illustrates an opening cutting two gate structures 108. However, an opening may extend any number of gate structures 108.

As described above, a series of etching steps in block 512, embodiments of the present disclosure may provide for a cut region that allows for a profile where a suitable etchant can reach a bottom of an opening (e.g., 1202) at an increased rate due to the widening of the opening profile (e.g., W2 of opening 118, which also applied to opening 1202). This can provide in some embodiments for a more complete isolation between cut segments of the gate structure, which can mitigate current leakage and thus, benefit transistor performance.

The method 500 proceeds to block 512 where fabrication is continued on the structure 600. In some embodiments, a dielectric layer is deposited in the cut region (e.g., opening 1202). In further embodiments, a CMP process is performed after deposition of the dielectric layer. The dielectric layer may be deposited over the hard mask layer, described above with reference to block 506. In other embodiments, the hard mask layer of block 506 may be removed prior to depositing the dielectric layer.

With reference to the example of FIGS. 13A and 13B in an embodiment of block 512, a dielectric layer 1402 may be deposited. In some embodiments, a CMP process is then performed to planarize a top surface of the dielectric layer 1402 (see FIGS. 14A, 14B, and 14C). In some embodiments, the dielectric layer 1402 may include silicon oxide, silicon nitride, oxynitride, and/or other suitable dielectric material layer. Thus, in various embodiments, the dielectric layer 1402 may further serve to electrically isolate gate metal lines of neighboring gate stacks. Dielectric layer 1402 may be a different composition that than of the ILD layer 306 and/or the isolation region 106. Having filled the opening 1202, it is noted that the dielectric layer 1402 interposing the gate structures 108 has the same dimensions and profile as discussed above.

The FinFET structure 600 may continue to undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an exemplary embodiment, a semiconductor device includes a first fin and a second fin each extending from a substrate. A first gate segment is disposed over the first fin and a second gate segment is disposed over the second fin. An interlayer dielectric (ILD) layer is adjacent the first gate segment and the second gate segment. A cut region (e.g., opening or gap between first gate structure and the second gate structure) extends between the first and second gate segments. The cut region has a first portion has a first width and a second portion has a second width, the second width is greater than the first width. The second portion interposes the first and second gate segments and the first portion is defined within the ILD layer.

In a further embodiment, a sidewall of the cut region extends from the first portion to the second portion is disposed at an angle $\ominus$ relative to a plane perpendicularly oriented to a length of the first fin and perpendicularly oriented to a top surface of the substrate. In another embodiment, the first width and the second width are measured from a top view of the region. In some embodiments, the cut region is filled with dielectric material. In some embodiments, the cut region extends into a shallow trench isolation feature between the first fin and the second fin. In a further embodiment, the cut region has a third width at a top surface of the shallow trench isolation feature and the second width between the first gate segment and the second gate segment above the third width. The third width and second width are measured on a plane parallel to a top surface of the substrate.

In an embodiment, the first gate segment has a first substantially linear sidewall and the second gate segment has a second substantially linear sidewall, wherein a dielectric material extends between the first and second substantially linear sidewalls.

In another embodiment a method of fabricating a semiconductor device is provided. The method includes forming a first fin and a second fin extending from a semiconductor substrate, wherein a shallow trench isolation (STI) extends between the first and second fins. A gate structure is formed extending over the first and second fins. A dielectric layer is disposed adjacent the gate structure. The gate structure and the dielectric layer are etched to form an opening in the gate structure extending at least to a top surface of the STI. The etching provides a first portion of the opening having a first width, the first portion may be defined by a first sidewall of a first cut segment of the gate structure and a second sidewall of a second cut segment of the gate structure. A second portion of the opening has a second width, the second portion of the opening has edges defined by the dielectric layer. The first width is greater than the second width. A third portion of the opening is disposed between the first portion and the second portion in a top view. The opening is filled with a dielectric material.

In some further embodiments, the third portion of the opening includes a sidewall disposed an angle $\Theta$, wherein the angle $\Theta$ is less than 45 degrees from a planar parallel a sidewall of the gate structure. In some embodiments, the etching includes a series of deposition steps and etching steps. In some embodiments, the series of deposition steps includes a polymer deposition step. In some embodiments, the series of deposition steps further includes depositing silicon.

In a further embodiment, a method of semiconductor device fabrication is provided that includes cutting a metal gate structure into a first metal gate segment and a collinear second metal gate segment. The cuttings include performing a first process to deposit a silicon layer and performing a second process to perform a breakthrough etch. The embodiment may include performing an etch of a work function metal layer of the metal gate structure. The etch can includes a high bias and high duty cycle. A polymer deposition step can be performed. The first process, the second process, the etch, and the polymer deposition step are repeated.

In a further embodiment, a high bias includes a power greater than about 1500 Watts (W) and a bias voltage over about 60 Volts (V). In an embodiment, the high duty cycle is greater than about 25%. In an embodiment, cutting forms an opening in the metal gate structure and an adjacent dielectric layer. In an embodiment, a width of the opening in the metal gate structure is greater than a width of the opening in the adjacent dielectric layer, the width being measured on a plane parallel a top surface of a semiconductor substrate comprising the metal gate structure. In a further embodiment, the cutting forms an opening in the metal gate structure and an underlying shallow trench isolation (STI) feature. In a further embodiment, a first width of the opening in the metal gate structure is less than a second width of the opening in the STI feature. Each of the first width and the second width may be measured on a plane parallel a length of the metal gate structure, the first width defined on a plane above the second width. In an embodiment, the repeating is performed seven times.

What is claimed is:

1. A semiconductor device, comprising:
   a first fin and a second fin each extending from a substrate;
   a first gate segment over the first fin and a second gate segment over the second fin;
   an interlayer dielectric (ILD) layer adjacent the first gate segment and the second gate segment; and
   a cut region extending between the first and second gate segments, wherein the cut region has a first portion having a first width and a second portion having a second width, the second width greater than the first width and wherein the second portion interposes the first and second gate segments and the first portion is defined within the ILD layer.

2. The semiconductor device of claim 1, wherein a sidewall of the cut region that extends from the first portion to the second portion is disposed at an angle $\Theta$ relative to a plane perpendicularly oriented to a length of the first fin and perpendicularly oriented to a top surface of the substrate.

3. The semiconductor device of claim 1, wherein the first width and the second width are measured from a top view of the region.

4. The semiconductor device of claim 1, wherein the cut region is filled with dielectric material.

5. The semiconductor device of claim 1, wherein the cut region extends into a shallow trench isolation feature between the first fin and the second fin.

6. The semiconductor device of claim 5, wherein the cut region has a third width at a top surface of the shallow trench isolation feature and the second width between the first gate segment and the second gate segment above the third width, wherein the third width and second width are measured on a plane parallel to a top surface of the substrate.

7. The semiconductor device of claim 1, wherein the first gate segment has a first substantially linear sidewall and the second gate segment has a second substantially linear sidewall, wherein a dielectric material extends between the first and second substantially linear sidewalls.

8. A method of fabricating a semiconductor device, comprising:
   forming a first fin and a second fin extending from a semiconductor substrate, wherein a shallow trench isolation (STI) extends between the first and second fins;
   forming a gate structure extending over the first and second fins;
   providing a dielectric layer adjacent the gate structure;
   etching the gate structure and the dielectric layer to form an opening in the gate structure extending at least to a top surface of the STI, wherein the etching forms the opening having:
      a first portion of the opening having a first width, the first portion defined by a first sidewall of a first cut segment of the gate structure and a second sidewall of a second cut segment of the gate structure;
      a second portion of the opening having a second width, the second portion of the opening has edges defined by the dielectric layer, and wherein the first width is greater than the second width; and
      a third portion of the opening being disposed between the first portion and the second portion in a top view; and
   filling the opening with a dielectric material.

9. The method of claim 8, wherein the third portion of the opening includes a sidewall disposed an angle $\Theta$, wherein the angle $\Theta$ is less than 45 degrees from a planar parallel a sidewall of the gate structure.

10. The method of claim 8, wherein the etching includes a series of deposition steps and etching steps.

11. The method of claim 10, wherein the series of deposition steps includes a polymer deposition step.

12. The method of claim 11, wherein the series of deposition steps further includes depositing silicon.

13. A method of semiconductor device fabrication including:
   cutting a metal gate structure into a first metal gate segment and a collinear second metal gate segment wherein the cutting includes:
   performing a first process to deposit a silicon layer;
   performing a second process to perform a breakthrough etch;
   performing an etch of a work function metal layer of the metal gate structure, wherein the etch includes a high bias and high duty cycle;
   performing a polymer deposition step; and
   repeating the first process, the second process, the etch, and the polymer deposition step.

14. The method of claim 13, wherein the high bias includes a power greater than about 1500 Watts (W) and a bias voltage over about 60 Volts (V).

15. The method of claim 13, wherein the high duty cycle is greater than about 25%.

16. The method of claim 13, wherein the cutting forms an opening in the metal gate structure and an adjacent dielectric layer.

17. The method of claim 16, wherein a width of the opening in the metal gate structure is greater than a width of the opening in the adjacent dielectric layer, the width being measured on a plane parallel a top surface of a semiconductor substrate comprising the metal gate structure.

18. The method of claim 13, wherein the cutting forms an opening in the metal gate structure and an underlying shallow trench isolation (STI) feature.

19. The method of claim 18, wherein a first width of the opening in the metal gate structure is less than a second width of the opening in the STI feature, each of the first width and the second width being measured on a plane parallel a length of the metal gate structure, the first width defined on a plane above the second width.

20. The method of claim 13, wherein the repeating is performed seven times.

\* \* \* \* \*